(12) United States Patent
Williams et al.

(10) Patent No.: US 7,026,191 B2
(45) Date of Patent: Apr. 11, 2006

(54) STEREOLITHOGRAPHIC METHOD FOR FABRICATING HEAT SINKS, STEREOLITHOGRAPHICALLY FABRICATED HEAT SINKS, AND SEMICONDUCTOR DEVICES INCLUDING SAME

(75) Inventors: Vernon M. Williams, Meridian, ID (US); Bret K. Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 10/449,219

(22) Filed: May 29, 2003

(65) Prior Publication Data
US 2003/0211657 A1 Nov. 13, 2003

Related U.S. Application Data

(62) Division of application No. 09/502,107, filed on Feb. 10, 2000, now Pat. No. 6,730,998.

(51) Int. Cl.
*H01L 21/44* (2006.01)

(52) U.S. Cl. .................. 438/122; 438/121; 438/123; 438/125

(58) Field of Classification Search ............. 438/108, 438/110, 113, 121, 123, 125, 114, 122; 257/675, 257/712–722
See application file for complete search history.

(56) References Cited

U.S. PATENT DOCUMENTS

| | | | |
|---|---|---|---|
| 4,526,646 A | 7/1985 | Suzuki et al. | |
| 4,543,659 A | 9/1985 | Ozaki | |
| 4,736,437 A | 4/1988 | Sacks et al. | |
| 4,863,538 A | 9/1989 | Deckard | |
| 4,899,921 A | 2/1990 | Bendat et al. | |
| 4,944,817 A | 7/1990 | Bourell et al. | |
| 5,017,753 A | 5/1991 | Deckard | |
| 5,059,559 A | 10/1991 | Takahashi et al. | |
| 5,088,047 A | 2/1992 | Bynum | |
| 5,113,565 A | 5/1992 | Cipolla et al. | |
| 5,132,143 A | 7/1992 | Deckard | |
| 5,145,099 A | 9/1992 | Wood et al. | |
| 5,155,321 A | 10/1992 | Grube et al. | |
| 5,155,324 A | 10/1992 | Deckard et al. | |
| 5,156,697 A | 10/1992 | Bourell et al. | |
| 5,173,220 A | 12/1992 | Reiff et al. | |
| 5,182,170 A | 1/1993 | Marcus et al. | |

(Continued)

*Primary Examiner*—Kevin M. Picardat
(74) *Attorney, Agent, or Firm*—TraskBritt

(57) ABSTRACT

A stereolithographically fabricated heat sink includes a heat transfer element cofigured to be disposed proximate a semiconductor device so as to absorb heat from the semiconductor device during use thereof. The heat sink also has a heat dissipation element that is configured to release heat as air flows past a surface thereof. When stereolithographic processes are used to fabricate the heat dissipation element of the heat sink, the heat dissipation element can have non-linear, or convoluted passageways formed therethrough, through which air can flow. As at least a portion of the heat sink is stereolithographically fabricated, that portion can have a series of superimposed, contiguous, mutually adhered layers of thermally conductive material. The layers can be fabricated by consolidated selected regions of a layer of unconsolidated particulate or powdered material, or by defining an object layer from a sheet of material. The stereolithographic method may include use of a machine vision system including at least one camera operably associated with a computer controlling a stereolithographic application of material so that the system may recognize the position and orientation of a semiconductor device or other substrate on which the heat sink is to be fabricated.

25 Claims, 6 Drawing Sheets

U.S. PATENT DOCUMENTS

| | | | |
|---|---|---|---|
| 5,238,174 A | 8/1993 | Ricketson et al. | |
| 5,252,264 A | 10/1993 | Forderhase et al. | |
| 5,264,061 A | 11/1993 | Juskey et al. | |
| 5,278,442 A | 1/1994 | Prinz et al. | |
| 5,284,695 A | 2/1994 | Barlow et al. | |
| 5,288,698 A | 2/1994 | Banjo et al. | |
| 5,304,329 A | 4/1994 | Dickens, Jr. et al. | |
| 5,316,580 A | 5/1994 | Deckard | |
| 5,325,265 A | 6/1994 | Turlik et al. | |
| 5,332,051 A | 7/1994 | Knowlton | |
| 5,342,919 A | 8/1994 | Dickens, Jr. et al. | |
| 5,352,405 A | 10/1994 | Beaman et al. | |
| 5,385,780 A | 1/1995 | Lee | |
| 5,430,666 A | 7/1995 | DeAngelis et al. | |
| 5,463,227 A | 10/1995 | Stern et al. | |
| 5,471,310 A | 11/1995 | Spigarelli et al. | |
| 5,484,314 A | 1/1996 | Farnworth | |
| 5,506,684 A | 4/1996 | Ota et al. | |
| 5,516,023 A | 5/1996 | Kono | |
| 5,516,026 A | 5/1996 | Arlye et al. | |
| 5,527,877 A | 6/1996 | Dickens, Jr. et al. | |
| 5,644,245 A | 7/1997 | Saitoh et al. | |
| 5,645,937 A * | 7/1997 | Noda et al. | 257/E23.111 |
| 5,648,450 A | 7/1997 | Dickens, Jr. et al. | |
| 5,672,312 A * | 9/1997 | Almquist et al. | |
| 5,673,258 A * | 9/1997 | Helbig et al. | |
| 5,693,981 A | 12/1997 | Schneider et al. | |
| 5,705,117 A * | 1/1998 | O'Connor et al. | |
| 5,733,497 A * | 3/1998 | McAlea et al. | |
| 5,749,041 A * | 5/1998 | Lakshminarayan et al. | |
| 5,814,536 A * | 9/1998 | Rostoker et al. | |
| 5,817,206 A * | 10/1998 | McAlea et al. | |
| 5,900,670 A * | 5/1999 | Schneider et al. | |
| 5,981,085 A * | 11/1999 | Ninomiya et al. | |
| 6,015,722 A * | 1/2000 | Banks et al. | |
| 6,111,313 A * | 8/2000 | Kutlu | 257/697 |
| 6,175,497 B1 | 1/2001 | Tseng et al. | |
| 6,251,488 B1 | 6/2001 | Miller et al. | |
| 6,259,962 B1 | 7/2001 | Gothait | |
| 6,268,584 B1 | 7/2001 | Keicher et al. | |
| 6,274,922 B1 * | 8/2001 | Choudhury et al. | 257/594 |
| 6,296,493 B1 * | 10/2001 | Michiya | |
| 6,391,251 B1 | 5/2002 | Keicher et al. | |
| 6,457,515 B1 * | 10/2002 | Vafai et al. | 257/E23.098 |
| 6,468,891 B1 * | 10/2002 | Williams | |

* cited by examiner

STEREOLITHOGRAPHIC METHOD FOR FABRICATING HEAT SINKS, STEREOLITHOGRAPHICALLY FABRICATED HEAT SINKS, AND SEMICONDUCTOR DEVICES INCLUDING SAME

CROSS-REFERENCE TO RELATED APPLICATION

This application is a divisional of application Ser. No. 09/502,107, filed Feb. 10, 2000 now U.S. Pat. No. 6,730,998, issued May 4, 2004.

BACKGROUND OF THE INVENTION

1. Field of the Invention

The present invention relates generally to heat sinks used to dissipate heat from semiconductor devices during normal operation thereof. Particularly, the present invention pertains to the use of stereolithographic techniques to fabricate heat sinks for use on semiconductor devices, to heat sinks so fabricated, and to semiconductor devices including stereolithographically fabricated heat sinks.

2. Background of Related Art

Heat Sinks

During normal use, semiconductor devices generate heat. Adequate dissipation of the heat generated during normal use of a semiconductor device is necessary for the safe and reliable operation of an electronic appliance that includes the semiconductor device. If the semiconductor device reaches an excessively high temperature, the integrated circuits of the semiconductor device can fail or a circuit board fire can result, damaging the electronic system of which the semiconductor device is a part.

While some semiconductor devices are able to dissipate sufficient amounts of heat without an additional heat sink or heat spreader, state of the art semiconductor devices with increased speed, circuit complexity, and circuit density often require added heat sinks.

In particular, as semiconductor devices have become more dense in terms of electrical power consumption per unit volume, heat generation has greatly increased, requiring package construction which dissipates the generated heat much more rapidly. As the state of the art progresses, the ability to adequately dissipate heat is often a severe constraint on the size, speed, and power consumption of an integrated circuit design.

In this application, a heat sink will be distinguished from, "heat spreader," the former pertaining to a structure with a heat transfer portion or element positioned proximate to a semiconductor device and a heat dissipation portion or element relatively more remote from the semiconductor device, the latter pertaining to a member which channels heat from a semiconductor die to leads which exit the die package. However, a heat sink and a heat spreader may together be used to cool a device.

Typically, heat sinks are fabricated from materials with good thermal conductivity, such as metals (e.g., aluminum, copper alloys, etc.), ceramic materials, and glass. The heat transfer portion of a heat sink is configured to absorb heat from the semiconductor device proximate thereto and, therefore, generally contours to at least a portion of a surface of the semiconductor device. The heat dissipation portion of a heat sink may include a series of small protrusions, which are typically referred to as "fins, " that receive heat from the heat transfer portion of the heat sink and are configured to dissipate the heat away from the semiconductor device as air flows between the fins. The shapes, sizes, arrangement, spacing, and numbers of fins on a heat sink are configured so as to optimize the heat dissipation capabilities of the heat sink with respect to the particular heat dissipation needs of a specific type of semiconductor device.

Heat sinks are typically manufactured separately from the semiconductor devices to which they are subsequently secured.

Conventionally, metal heat sinks have been manufactured by extrusion or casting processes. When extruded, molten metal is forced through an extrusion die to produce an elongated extrusion of a cross-section taken transverse to the length thereof of a desired heat sink configuration. The elongate extrusion is then sectioned transverse to the length thereof to provide the heat sinks. Cast heat sinks are manufactured by disposing a molten quantity of heat conductive material into a refractory mold.

Heat sinks can also be machined from blocks of material. As conventional heat sinks have spaced apart fins, however, machining processes waste a considerable amount of material. In addition, due to the small size and high complexity of conventional heat sinks, the use of machining processes can be very time consuming and expensive. For these reasons, the use of machining processes to manufacture heat sinks is somewhat undesirable.

The use of extrusion, casting, and machining processes to manufacture heat sinks are also somewhat undesirable since each of the processes limit the possible configurations of the manufactured heat sinks. For example, when extrusion is used, the transverse cross-section taken along the entire length of each heat sink has the same two-dimensional shape, being that imparted by the two-dimensional configuration of the extrusion die. When heat sinks are cast, the configurations thereof are determined by the casting molds. Typically, molds have two parts, and may include additional inserts to facilitate the formation of more complex features. State-of-the-art machining processes are limited to, at most, seven axes. Typically, however, less complex three-axis or five-axis machines are used. Nonetheless, certain types of features, such as internally confined cavities and non-linear channels cannot be formed easily when casting or state-of-the-art machining equipment is used.

An alternative method for manufacturing heat sinks is disclosed in U.S. Pat. No. 5,814,536, issued to Rostoker et al. on Sep. 29, 1998 (hereinafter "the '536 Patent"). The '536 Patent discloses the use of powder metallurgy techniques to form a heat sink. Thus, the heat sink is formed from a mixture of powdered metal (e.g., copper, aluminum, tungsten, titanium, and alloys thereof) and a suitable binder. The mixture is placed into a mold, where the metal particles are bonded to adjacent particles, or sintered together, under appropriate pressure and at an appropriate temperature. The binder, if any, is removed (i.e., burned off) during the sintering process. The sintered heat sink can then be machined to provide features that may not be readily obtained or possible to obtain by the sintering process alone. Since the sintering process of the '536 Patent employs a mold, it is somewhat undesirable due to the previously mentioned conformational limitations that are present when a mold is used.

As noted above, a prefabricated heat sink is conventionally assembled with a semiconductor device. The assembly can then be packaged by known techniques, such as by transfer molding of a particle-filled polymer, as known in the art. If such an assembly is packaged, however, the packaging mold must usually be configured so as to receive at least a portion of the heat sink to permit its projection beyond the polymer packaging. The manufacture of molds configured to receive heat sinks is somewhat undesirable due to the complexity of the mold designs and the high costs of machining such molds.

The art does not teach a method of fabricating heat sinks on semiconductor devices or of fabricating heat sinks by stereolithography, or layered manufacturing, processes.

Stereolithography

In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and non-metallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, fixed, or semisolid state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed, or a separate binder material may be employed to bond material particles to one another and to those of a previously-formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. In particular, the inventor is not aware of the use of stereolithography to fabricate heat sinks for use with semiconductor devices. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

According to one aspect, the present invention includes a method for fabricating heat sinks for use with semiconductor devices. In a preferred embodiment of the method, a computer-controlled, 3-D CAD initiated process known as "stereolithography" or "layered manufacturing" is used to fabricate the heat sinks. When stereolithographic processes are employed, a heat sink is formed as a series of superimposed, contiguous, mutually adhered layers of material.

As it is important that heat sinks absorb heat from a proximate semiconductor device and dissipate the heat, the heat sinks of the present invention are preferably manufactured from materials that are good heat conductors. Accordingly, the stereolithography processes that are preferred for fabricating the heat sinks of the present invention are capable of fabricating structures from materials with good thermal conductivity.

In one such stereolithography process, known as "selective laser sintering" or "SLS," structures are fabricated from layers of powdered or particulate material. The particles in selected regions of each of the layers can be bonded together by use of a laser under the control of a computer. The laser either heats the material particles and sinters adjacent particles together, heats a binder material mixed in with the particles to bond the particles, or heats a binder material with which the material particles are coated to secure adjacent particles in the selected regions of a layer to one another.

Another exemplary stereolithography process that may be used to fabricate heat sinks incorporating teachings of the present invention is referred to as "laminated object manufacturing" or "LOM." Laminated object manufacturing involves the use of a laser or other cutting device to define the peripheries of a layer of an object from a sheet of material. Adjacent layers of the object are secured to one another to form the object.

The stereolithographic heat sink fabrication method of the present invention preferably includes the use of a machine vision system to locate the semiconductor devices or substrates upon which heat sinks are to be fabricated, as well as the features or other components on or associated with the semiconductor devices or substrates (e.g., bond wires, leads, etc.). The use of a machine vision system directs the alignment of a stereolithography system with each semiconductor device or substrate for material disposition purposes. Accordingly, the semiconductor devices or substrates need not be precisely mechanically aligned with any component of the stereolithography system to practice the stereolithographic embodiment of the method of the present invention.

In a preferred embodiment, the heat sink to be fabricated upon a semiconductor device component in accordance with the invention is fabricated using precisely focused electromagnetic radiation in the form of a laser under control of a computer and responsive to input from a machine vision system, such as a pattern recognition system, to define each layer of the object to be formed from a layer of material disposed on the semiconductor device or substrate.

According to another aspect, the present invention includes stereolithographically fabricated heat sinks, as well as semiconductor devices that include stereolithographically fabricated heat sinks. As stereolithographic processes are used to fabricate these heat sinks, the heat sinks may be formed with features that cannot be defined by use of conventional extrusion, sintering, or machining processes.

Other features and advantages of the present invention will become apparent to those of skill in the art through consideration of the ensuing description, the accompanying drawings, and the appended claims.

DETAILED DESCRIPTION OF THE INVENTION

Heat Sinks

According to one aspect, the present invention includes heat sinks and assemblies including a semiconductor device and a heat sink. The heat sinks of the present invention are stereolithographically fabricated, or layer-manufactured. Thus, heat sinks incorporating teachings of the present invention have a plurality of superimposed, contiguous, mutually adhered layers of heat conductive material. Moreover, since layered manufacturing processes can be used to fabricate features, such as internally confined cavities and non-linear or convoluted passageways, that cannot be fabricated by use of other processes, heat sinks incorporating teachings of the present invention can include such features. FIGS. 1–5 illustrate exemplary configurations of heat sinks incorporating teachings of the present invention.

Figure 1:
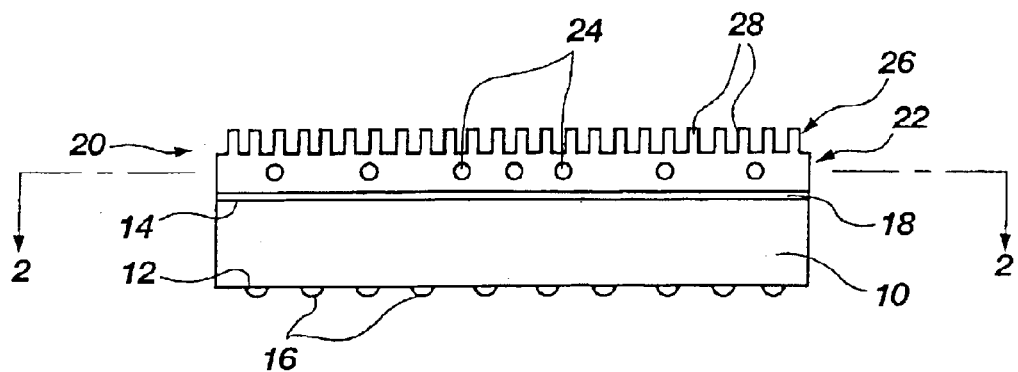
FIG. 1 is a side view of a semiconductor device with a heat sink embodying teachings of the present invention secured to a surface thereof.

With reference to FIG. 1, an assembly is shown that includes a semiconductor device 10 and a heat sink 20 incorporating teachings of the present invention. As illustrated, semiconductor device 10 is a flip-chip type semiconductor device, such as a flip-chip die or ball grid array package, with conductive structures 16 protruding from an active surface 12 thereof. A thin layer 18 of thermally conductive adhesive material, such as a suitable epoxy, is disposed on an opposite, backside 14 of semiconductor device 10. The adhesive material of layer 18 preferably withstands high temperatures, such as those that will occur during normal operation of semiconductor device 10.

Layer 18 secures a heat transfer element 22 of heat sink 20 proximate backside 14. Heat transfer element 22 is configured to transfer heat that is generated during use of semiconductor device 10 away from semiconductor device 10. Accordingly, it is preferred that layer 18 be formed from a material that will readily conduct heat.

Figure 2:
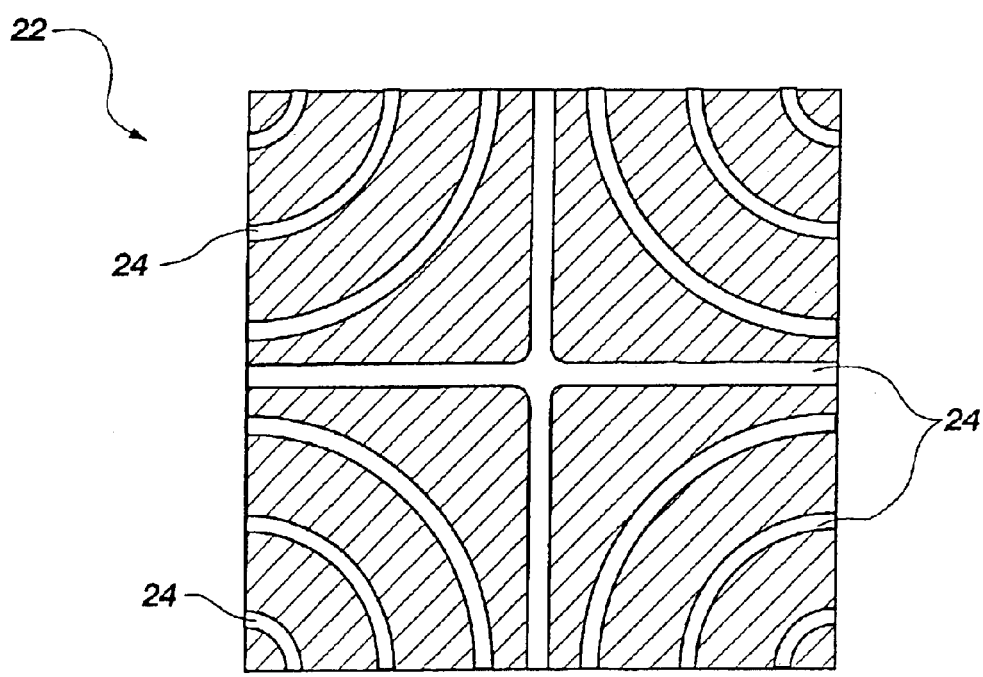
FIG. 2 is a cross-section taken along line 2—2 of FIG. 1.

As illustrated, heat transfer element 22 of heat sink 20 has channels 24 extending therethrough. Channels 24 are configured to permit air to flow through heat transfer element 22 and to thereby facilitate cooling of semiconductor device 10 as the air flowing through channels 24 carries heat away, or dissipates heat, from heat transfer element 22. As shown in FIG. 2, channels 24 may be non-linear or convoluted. Channels 24 are preferably configured so as to facilitate the desired amount of air flow through heat transfer element 22 of heat sink 20 and, thus, to facilitate a desirable level of heat dissipation away from semiconductor device 10.

Heat sink 20 also has a heat dissipation element 26 adjacent heat transfer element 22, opposite semiconductor device 10. Heat dissipation element 26 includes several upwardly extending fins 28. Fins 28 are spaced apart so as to permit air to flow therebetween and, thus, to dissipate heat away from semiconductor device 10.

Figure 3:
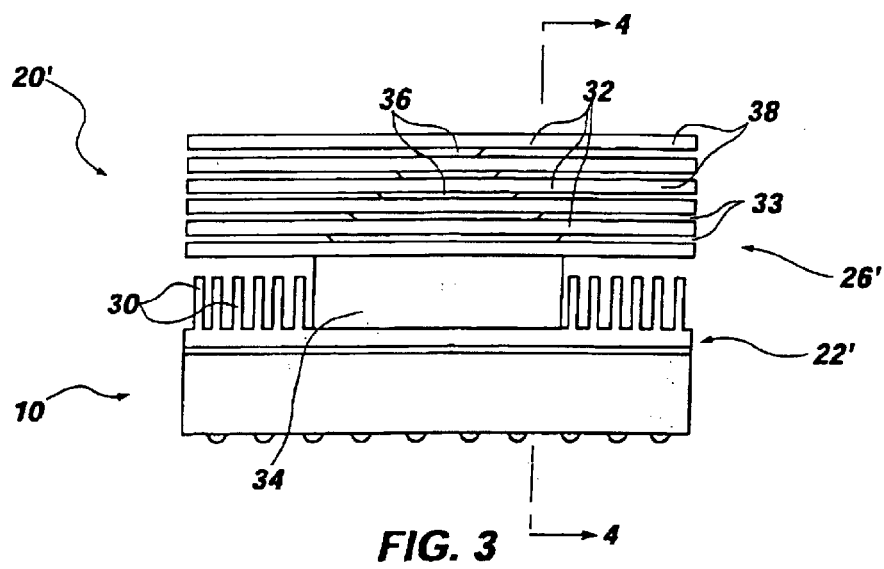
FIG. 3 is a side view of a semiconductor device with another heat sink embodying teachings of the present invention secured to a surface thereof.
Figure 4:
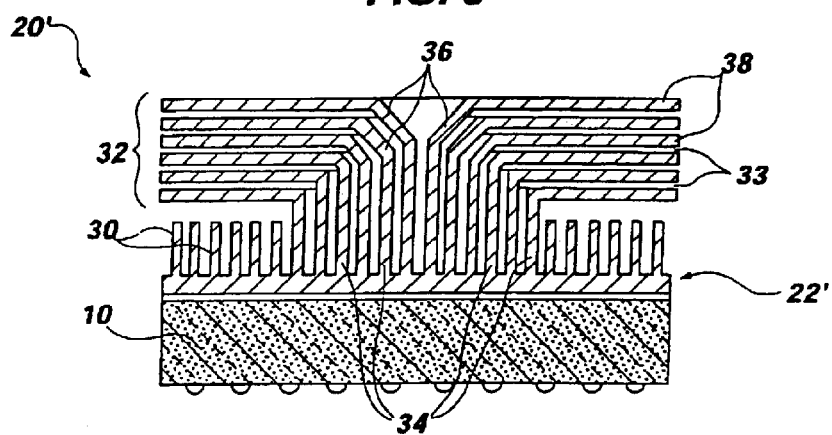
FIG. 4 is a cross-section taken along line 4—4 of FIG. 3.
Figure 5:
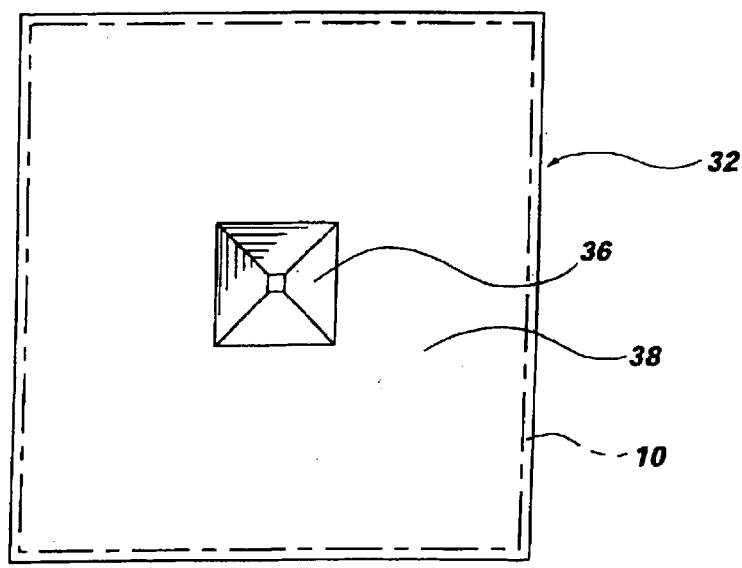
FIG. 5 is a top view of the semiconductor device shown in FIGS. 3 and 4.

FIGS. 3–5 illustrate an assembly that includes a semiconductor device 10 and another embodiment of a heat sink 20' incorporating teachings of the present invention. Heat sink 20' includes solid heat transfer element 22' and a heat dissipation element 26' adjacent heat transfer element 22', opposite semiconductor device 10.

Heat dissipation element 26' includes two sets of fins 30 and 32. Fins 30 are linear and protrude upwardly from heat transfer element 22'. Fins 32 are spaced apart and positioned substantially concentrically relative to each other. As shown in FIGS. 3 and 4, spaces 33 between adjacent fins 32 are non-linear or convoluted passageways through which air can flow. Each fin 32 has an upwardly protruding region 34, a bend 36, and a laterally extending region 38.

Figure 10:
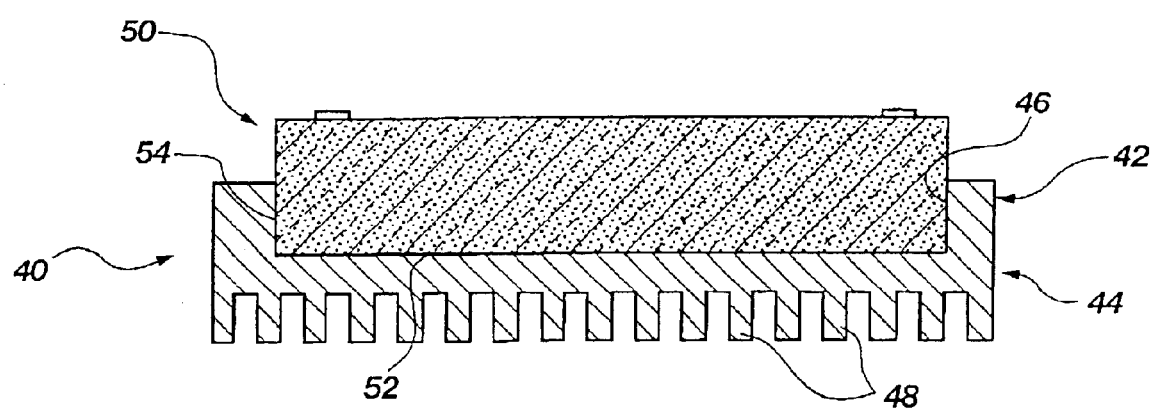
FIG. 10 is a cross-sectional view of another embodiment of a heat sink according to the present invention, depicting the heat sink disposed adjacent a surface of a semiconductor device.

Turning now to FIG. 10, another embodiment of a heat sink 40 according to the present invention is illustrated. Heat sink 40 has a heat transfer element 42 and a heat dissipation element 44. A receptacle 46 formed in heat transfer element 42 is configured to receive at least a portion of a semiconductor device 50. As illustrated, receptacle 42 receives a backside 52 and a lower portion of the periphery 54 of semiconductor device 50. Receptacle 46 conforms to a portion of the surface of semiconductor device 50 and contacts the entire backside 52, as well as a portion of the periphery 54 thereof to cup semiconductor device 50 to facilitate the transfer of heat therefrom to heat sink 40. Heat dissipation element 44, which is remote from semiconductor device 50, has spaced apart fins 48 extending therefrom.

Methods of Fabricating Heat Sinks

In another aspect, the present invention includes methods of fabricating heat sinks according to the present invention, such as those illustrated in and described with reference to FIGS. 1–5.

Figure 6:
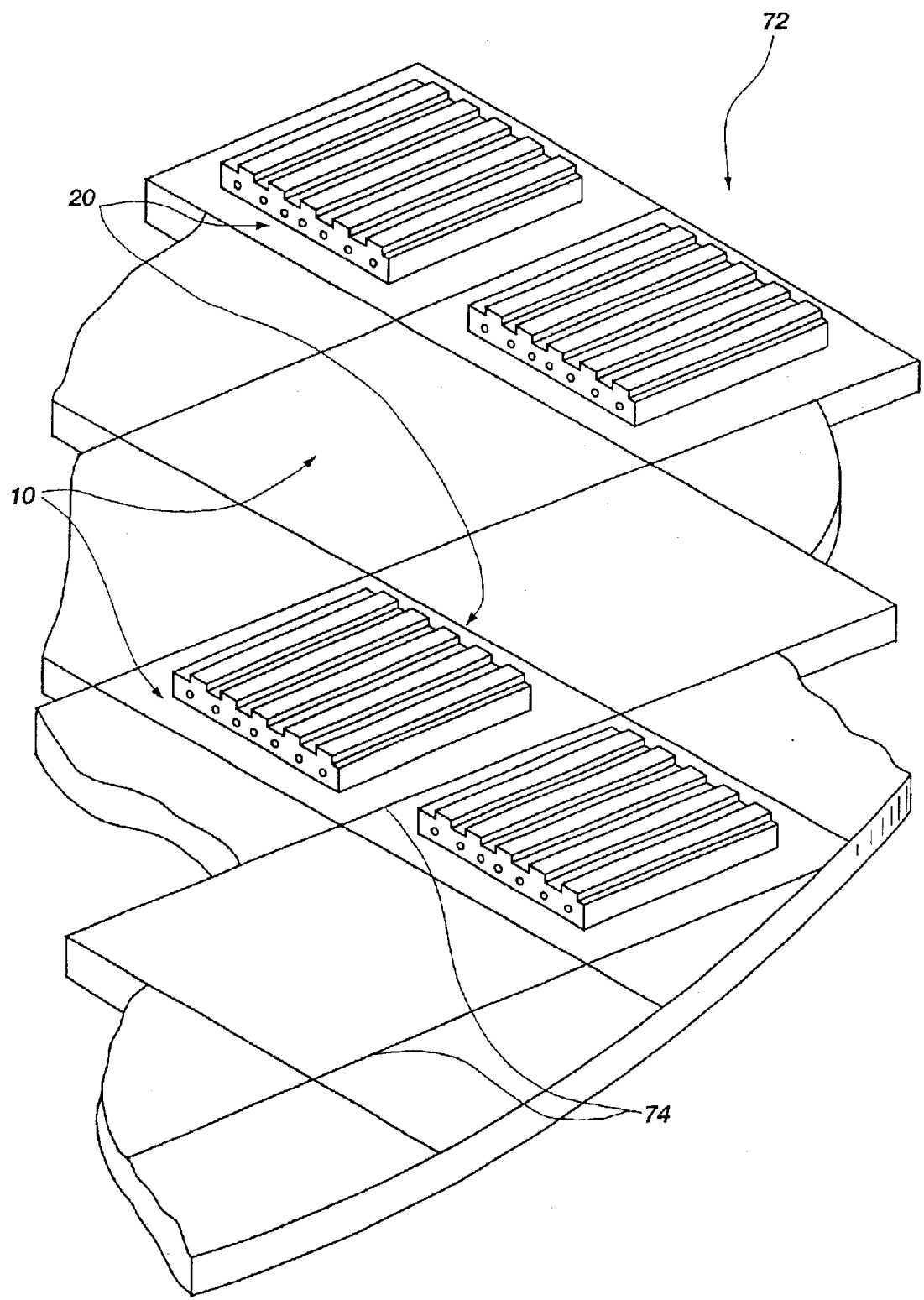
FIG. 6 is a partial perspective view of a semiconductor wafer with unsingulated semiconductor devices having heat sinks fabricated on the backsides thereof.

Turning now to FIG. 6, heat sinks 20 according to the present invention can be assembled with or fabricated on backsides 14 of semiconductor devices 10, such as bare or minimally packaged semiconductor dice, while semiconductor devices 10 are still part of a wafer 72. Each semiconductor device 10 on wafer 72 is separated from adjacent semiconductor devices 10 by a street 74.

While the heat sink fabrication process of the present invention is preferably performed substantially simultaneously on several semiconductor devices or other substrates, such as prior to singulating semiconductor devices 10 from wafer 72 or on a collection of individual semiconductor devices or other substrates, such as partial wafers, individual semiconductor devices or other substrates can also be provided with heat sinks in accordance with teachings of the present invention. As another alternative, the method of the present invention can be used to substantially simultaneously fabricate heat sinks 20 on a collection of different types of semiconductor devices or other substrates.

The heat sinks of the present invention are preferably fabricated from a thermally conductive material, such as copper, aluminum, tungsten, titanium, or a ceramic material. By way of example and not to limit the scope of the present invention, the heat sinks can be manufactured from thermally conductive materials in powdered or particulate form or in the form of thin sheets.

For simplicity, the ensuing description is limited to an explanation of a method of stereolithographically fabricating heat sinks 20 directly on semiconductor devices 10 having bare backsides 14. As should be appreciated by those of skill in the art, however, the method described herein is also useful for fabricating heat sinks separately from a semiconductor device or other substrate, as well as for disposing heat sinks on packaged semiconductor devices or semiconductor devices having one or more layers of protective material on the backsides thereof. However, the effectiveness of heat transfer from a packaged or coated device will naturally be somewhat compromised.

Stereolithography Apparatus and Methods

Figure 7:
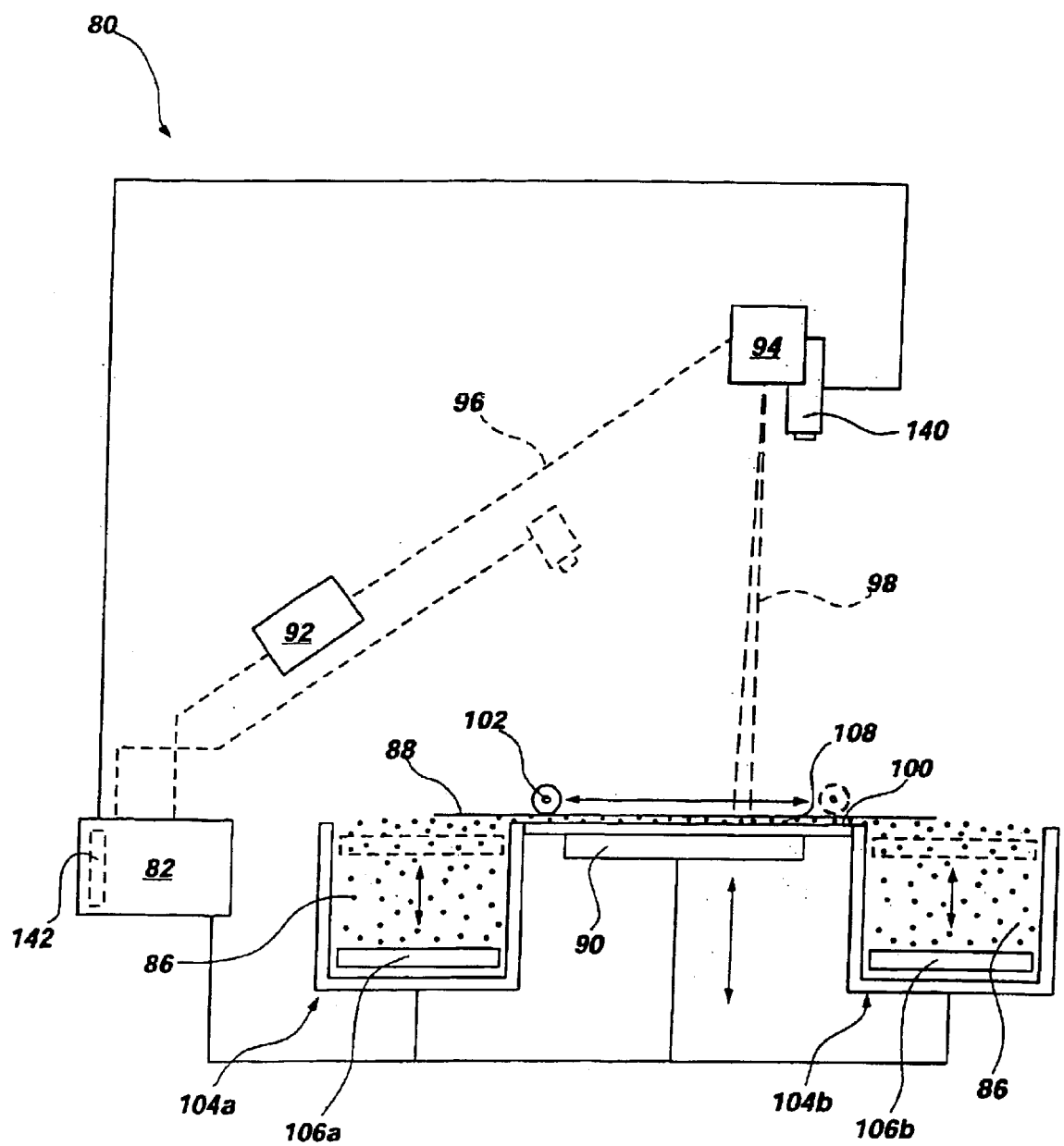
FIG. 7 is a schematic representation of an exemplary stereolithography apparatus, a selective laser sintering apparatus, that can be employed in the method of the present invention to fabricate heat sinks on semiconductor devices or other substrates in accordance with the method of the present invention.

FIG. 7 schematically depicts various components, and operation, of an exemplary stereolithography apparatus 80 to facilitate the reader's understanding of the technology employed in implementation of the method of the present invention, although those of ordinary skill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States Patents assigned to DTM Corporation or to Board of Reagents, The University of Texas System, both of Austin, Tex., or to The B.F. Goodrich Company of Akron, Ohio, such patents including, without limitation, U.S. Pat. Nos. 4,863,538; 4,944,817; 5,017,753; 5,132,143; 5,155,321; 5,155,324; 5,156,697; 5,182,170; 5,252,264; 5,284,695; 5,304,329; 5,316,580; 5,332,051; 5,342,919; 5,352,405; 5,385,780; 5,430,666; 5,527,877; 5,648,450; 5,673,258; 5,733,497; 5,749,041; and 5,817,206. The disclosure of each of the foregoing patents is hereby incorporated herein by this reference.

With continued reference to FIG. 7 and as noted above, a 3-D CAD drawing, in the form of a data file, of an object (e.g., heat sink 20 of FIGS. 1 and 2) to be fabricated is placed in the memory of a computer 82 controlling the operation of apparatus 80, if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Data from the STL files resident in computer 82 is manipulated to build an object, such as a heat sink 20, illustrated in FIGS. 1 and 2, one layer at a time. Accordingly, the data mathematically representing one or more objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.003 to about 0.020 inch thick. As mentioned previously, a thinner slice promotes higher resolution by enabling better reproduction of fine vertical surface features of the object or objects to be fabricated.

Apparatus 80 includes a horizontal platform 90 on which an object is to be fabricated or a substrate disposed for fabrication of an object thereon. Platform 90 is preferably vertically movable in fine, repeatable increments responsive to computer 82. Material 86 is disposed in a substantially uniform layer of desired thickness by a particulate spreader that operates under control of computer 82. The particulate spreader includes two cartridges 104*a* and 104*b* disposed adjacent platform 90 and a roller or scraper bar or blade 102 that is vertically fixed and horizontally movable across platform 90. As a sufficient quantity of particulate material 86 to form a layer of desired thickness is pushed upward out of each cartridge 104*a*, 104*b* by a vertically movable support 106*a*, 106*b*, respectively, roller or scraper bar or blade 102 spreads that quantity of particulate material 86 in a uniform layer of desired thickness (e.g., 0.003 to 0.020 inches) over platform 90, a substrate disposed thereon, or an object being fabricated on platform 90 or a substrate thereon. Supports 106*a*, 106*b* of cartridges 104*a*, 104*b* are preferably vertically movable in fine, repeatable increments under control of computer 82.

By way of example and not limitation, and as noted above, the layer thickness of material 86 to be formed, for purposes of the invention, may be on the order of about 0.003 to 0.020 inch, with a high degree of uniformity. It should be noted that different material layers may have different heights, so as to form a structure of a precise, intended total height or to provide different material thicknesses for different portions of the structure.

With continuing reference to FIG. 7, in a selective laser sintering embodiment of the heat sink fabrication process of the present invention, material 86 preferably comprises resin-coated particles of one or more thermally conductive materials, such as copper, aluminum, tungsten, titanium, ceramics, or a mixture of any of the foregoing, which material 86 is deposited by cartridges 104*a*, 104*b* and roller or roller or scraper bar or blade 102 over platform 90 with the latter in its uppermost position. Alternatively, the particles of thermally conductive material may be uncoated, and used alone or mixed with particles of a suitable binder resin.

A fixative head, such as a laser 92, an ink jet nozzle, or a metal spray gun, is suspended above platform 90. The type of fixative head employed depends upon the nature of the particulate material 86 employed to fabricate the object, as well as an optional binder employed to consolidate particles of material 86 in selected regions of the layer.

When the fixative head includes a laser 92, apparatus 80 may also include a galvanometer 94 with one or more pivotal mirrors. Before fabrication of a first layer of an object is commenced, the operational parameters for apparatus 80 are set to adjust the size (diameter, if circular) of the laser light beam used to consolidate or fix material 86. In addition, computer 82 automatically checks and, if necessary, adjusts by means known in the art the surface level 88 of material 86 over platform 90 or a substrate upon which an object is to be fabricated to maintain same at an appropriate focal length for laser beam 98. Alternatively, the height of the mirror of galvanometer 94 may be adjusted responsive to a detected surface level 88 to cause the focal point of laser beam 98 to be located precisely at the surface of material 86 at surface level 88 if level 88 is permitted to vary, although this approach is more complex.

The size of the laser beam "spot" impinging on the surface of material 86 to consolidate or fix same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the "field of exposure." such area being substantially coextensive with the vision field of a machine vision system employed in the apparatus of the invention as explained in more detail below. The longer and more effectively vertical the path of laser beam 96/98, the greater the achievable resolution.

The sequence of operation and movements of platform 90, cartridges 104*a*, 104*b* and their supports 106*a*, 106*b*, roller 102 or scraper, and laser 92 or another type of fixative head are controlled by computer 82.

Once roller or scraper bar or blade 102 spreads and smooths material 86 into a first thin layer 108 of substantially uniform thickness (for example, 0.003 to 0.020 inches) over platform 90 or a substrate disposed thereon, laser 92 directs a laser beam 96 toward galvanometer94-mounted mirrors, which reflect a laser beam 98 toward selected regions of layer 108 in order to affix the particles of material 86 in the selected regions by melting or sintering particles of the thermally conductive component of material 86 or by melting a binder component of material 86 to secure adjacent particles of the thermally conductive component of material 86 that are exposed to laser beam 98 to one another. Particles of material 86 in these selected regions of layer 108 are preferably affixed in a regular horizontal pattern representative of a first or lowermost transverse layer or slice of the object to be fabricated, as numerically defined and stored in computer 82. Accordingly, laser beam 98 is directed to impinge on particle layer 108 in those areas where the corresponding layer of the object to be fabricated is comprised of solid material and avoids those areas outside of a periphery of the corresponding layer of the object to be fabricated, as well as those areas of the corresponding layer where a void or aperture exists. Laser 98 is withdrawn upon consolidation of material 86 in regions comprising at least the peripheral outline of the corresponding layer of the object being fabricated.

Figure 9:
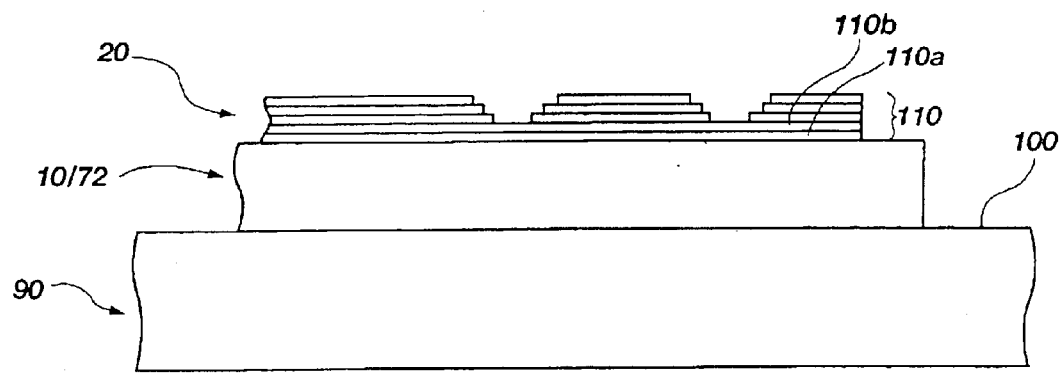
FIG. 9 is a partial cross-sectional side view of a semiconductor device or substrate disposed on a platform of a stereolithographic apparatus and depicting a heat sink being fabricated on the semiconductor device or substrate.

With reference to FIG. 9, when material 86 in each of the regions of layer 108 that correspond to solid areas of the corresponding layer of the object to be fabricated have been exposed to laser beam 98, a first particle layer 110, or first preform layer, is formed. First particle layer 110 has at least the peripheral outline of the corresponding layer of the object being fabricated at that vertical or longitudinal level, material 86 within apertures or voids in layer 110 remaining unconsolidated as loose, unfused particles.

Next, platform 90 is indexed downwardly a vertical distance which may or may not be equal to the thickness of the just-fabricated layer 110*a* (i.e., a layer-manufactured structure may have layers of different thicknesses). Another layer 110*b* of unconsolidated particulate material 86 is then formed over layer 110*a* as previously described. Laser beam 98 is then again directed toward selected regions of the new layer 110*b* to follow a horizontal pattern representative of a next, higher layer or slice of the object to be fabricated, as numerically defined and stored in computer 82. As each successive layer 110 is formed by consolidating material 86 in selected regions, the consolidated material is preferably also secured to the immediately underlying, previously fabricated layer 110*a*. It will be appreciated that, in FIG. 9, the thicknesses of each layer 110 has been exaggerated to clearly illustrate the layered manufacturing process.

Of course, since an object to be fabricated by use of a stereolithography apparatus, such as apparatus 80, may not have uniformly configured and sized cross-sections taken transverse to the length thereof, adjacent layers or slices of the object, while contiguous, may not be identical.

The deposition and smoothing of layers 108 of unconsolidated particles of material 86 and the selective fusing of particles of material 86 in selected regions of each successive layer 108 is continued under control of computer 82 for hundreds or even thousands of layers until a recognizable three-dimensional structure gradually emerges, and the layering process is further continued until a completed object has been fabricated. At any time during the fabrication process, or thereafter, unconsolidated particulate material 86 is removed and may be recovered. Any recovered material may be subsequently used to form another object.

As an alternative to the use of a laser to sinter or otherwise bond particles of material 86 in the selected regions of each layer 108 together to form layers 110, an ink jet nozzle or a metal spray gun may be employed as the fixative head. Such a fixative head deposits a liquid binder (e.g., resin or metal) over the particles of material 86 in selected regions of each layer 108, penetrating therebetween and solidifying, thus bonding particles in the selected regions of layer 108 to at least partially consolidated regions of the next underlying formed layer 110. If an ink jet nozzle is employed as the fixative head, the binder may comprise a non-metallic binder such as a polymer compound. Alternatively, when a metal spray gun is used as the fixative head, a metallic binder such as a copper or zinc alloy or Kirksite, a proprietary alloy available through Industrial Modern Pattern and Mold Corp., may be employed. In the case of a metal alloy, the binder may be supplied in wire form which is liquified (as by electric arc heating) and sprayed onto the uppermost particulate layer. Another alternative is to liquify the distal end of the binder wire with a laser or other heating means immediately above the unconsolidated powder layer rather than using a metal spray.

Figure 8:
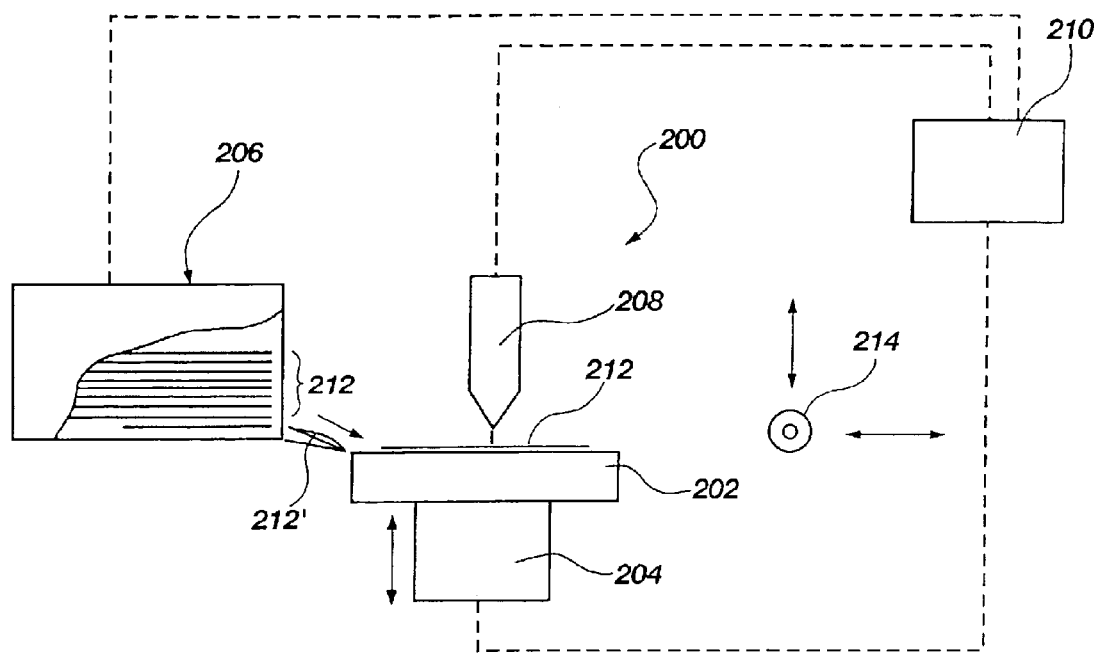
FIG. 8 is a schematic representation of another exemplary stereolithographic apparatus, a laminated object manufacturing apparatus, that can be employed in the method of the present invention to fabricate heat sinks in accordance with the method of the present invention.

FIG. 8 illustrates a laminated object manufacturing (LOM) variation of the heat sink fabrication process of the present invention. LOM employs sheets of material to form an object. As depicted in FIG. 8, an apparatus 200 for effecting the LOM method includes a platform 202, actuating means 204 for moving platform 202 in vertical increments, a sheet feeder 206, a laser head 208, and a control computer 210. Sheet feeder 206 may comprise a photocopier-type feeder and provide individual sheets, or may comprise a roll-type feeder with a feed roller and a take-up roller, as desired. In either case, a sheet 212 of suitable material, such as a thin metal (e.g., copper, aluminum, tungsten, titanium, etc.) or a ceramic or glass sheet, is placed on platform 202. Laser head 208, under control computer 210, cuts an outline of the periphery of that layer of the object being fabricated. The surrounding sheet material may then be removed, if desired, and a second, uncut sheet 212' placed over sheet 212 is bonded to sheet 212 by suitable means, after which laser head 208 cuts the perimeter outline of the second layer of the object. If desired, the laser may be used to rapidly heat the second sheet 212' and bond it to the first sheet 212 before sheet 212' is cut at its periphery. Alternatively, a heated roller 214 may be biased against and rolled over the uppermost sheet 212' to secure the uppermost sheet 212' and the immediately adjacent, underlying sheet 212 to each other before the uppermost sheet 212' is cut to define the periphery of the corresponding layer of the object being fabricated. The embodiment of FIG. 8 is particularly suitable for substantially concurrently forming a large plurality of heat sinks on the backside of an unsingulated semiconductor wafer or other large-scale substrate.

Such bonding can be effected by melting or sintering, or by an adhesive material disposed on the top, bottom, or both surfaces of each sheet. One or both surfaces of the sheets may be pre-coated with adhesive, or adhesive may be applied thereto, such as by rolling or spraying, during the layered manufacturing process.

Referring again to FIG. 7, in practicing the present invention, a commercially available stereolithography apparatus operating generally in the manner as that described above with respect to apparatus 80 is preferably employed, but with further additions and modifications as hereinafter described for practicing the method of the present invention. For example and not by way of limitation, the SINTERSTATION® 2000, SINTERSTATION® 2500, and SINTERSTATION® 2500 plus stereolithography systems, each offered by DTM Corporation of Austin, Tex., are suitable for modification.

It should be noted that apparatus 80 useful in the method of the present invention includes a camera 140 which is in communication with computer 82 and preferably located, as shown, in close proximity to galvanometer 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated herein by this reference.

Of course, apparatus 200 depicted in FIG. 8 could also be equipped with such a machine vision system.

Stereolithographic Fabrication of the Heat Sinks

Referring now to FIGS. 7 and 9, in order to facilitate fabrication of one or more heat sinks 20 in accordance with the method of the present invention with apparatus 80, a data file representative of the size, configuration, thickness and surface topography of, for example, a particular type and design of semiconductor device 10 or other substrate upon which one or more heat sinks 20 are to be fabricated is placed in the memory of computer 82. Also, it may be desirable to place a data file representative of the various features of semiconductor device 10 in memory.

One or more semiconductor devices 10, wafers 72, or other substrates may be placed on surface 100 of platform 90 to have heat sinks 20 fabricated thereon. Camera 140 is then activated to locate the position and orientation of each semiconductor device 10, including those on a wafer 72, or other substrate. The features of each semiconductor device 10, wafer 72, or other substrate are compared with those in the data file residing in memory, the locational and orientational data for each semiconductor device 10, wafer 72, or other substrate then also being stored in memory. It should be noted that the data file representing the design size, shape and topography for each semiconductor device 10 or other substrate may be used at this juncture to detect physically defective or damaged semiconductor devices 10 or other substrates prior to fabricating a heat sink 20 thereon or before conducting further processing or assembly of semiconductor device 10 or other substrates. Accordingly, such damaged or defective semiconductor devices 10 or other substrates can be deleted from the stereolithographic heat sink fabrication process, from further processing, from further testing, or from assembly with other components. It should also be noted that data files for more than one type (size, thickness, configuration, surface topography) of semiconductor device 10 or other substrate may be placed in computer memory and computer 82 programmed to recognize not only the locations and orientations of each semiconductor device 10 or other substrate, but also the type of semiconductor device 10 or other substrate at each location upon platform 90 so that material 86 may be at least partially consolidated by laser beam 98 in the correct pattern and to the height required to fabricate heat sinks 20 in the appropriate, desired locations on each semiconductor device 10 or other substrate.

Continuing with reference to FIGS. 7 and 9, a substantially uniform layer 108 of material 86 is disposed over wafer 72 or the one or more semiconductor devices 10 or other substrates on platform 90 to a depth substantially equal to the desired thickness of a formed layer 110 of heat sink 20.

Laser 92 is then activated and scanned to direct beam 98, under control of computer 82, toward specific locations of surface 88 relative to each semiconductor device 10 or other substrate to effect the aforementioned partial cure of material 86 to form a first layer 110a of each heat sink 20. Platform 90 is then lowered and another layer 108 of material 86 of a desired thickness disposed over formed layer 110a. Laser 92 is again activated to add another layer 110b to each heat sink 20 under construction. This sequence continues, layer by layer, until each of the layers 110 of each heat sink 20 have been completed.

In FIG. 9, the first, bottommost layer of heat sink 20 is identified by numeral 110a, and the second layer is identified by numeral 110b. As illustrated, heat sink 20 has only a few layers 110. In practice of the invention, however, heat sinks 20 will often have many thin layers 110. Accordingly, heat sinks 20 with any number of layers 110 are within the scope of the present invention.

Each layer 110 of heat sink 20 may be built by first defining any internal and external object boundaries of that layer with laser beam 98, then hatching solid areas of that layer of heat sink 20 located within the object boundaries with laser beam 98. An internal boundary of a layer may comprise a portion of a channel 24, a space between adjacent fins 32 (see FIGS. 3–5), a through-hole, a void, or a recess in heat sink 20, for example. If a particular layer includes a boundary of a void in the object above or below that layer, then laser beam 98 is scanned in a series of closely-spaced, parallel vectors so as to develop a continuous surface, or skin, with improved strength and resolution. The time it takes to form each layer 110 depends upon the geometry thereof, the surface tension and viscosity of material 86, and the thickness of that layer.

Once heat sinks 20 have been fabricated, platform 90 is elevated and removed from apparatus 80, along with any substrate (e.g., semiconductor device 10, wafer 72 (see FIG. 6), or other substrate) disposed thereon and any stereolithographically fabricated structures, such as heat sink 20. Excess, unconsolidated material 86 (e.g., excess powder or particles) may be manually removed from platform 90, from any substrate disposed thereon, and from heat sink 20. Each semiconductor device 10, wafer 72, or other substrate is removed from platform 90.

Residual particles of the thermally conductive material that was used to fabricate heat sink 20 are preferably removed by use of known solvents or other cleaners that will not substantially degrade, deform, or damage heat sink 20 or the substrate (e.g., semiconductor device 10) on which heat sink 20 was fabricated. Such cleaning is particularly important when electrically conductive materials, such as copper, aluminum, tungsten, or titanium, are used to fabricate heat sink 20, as a residue of such electrically conductive materials can cause electrical shorts that will result in failure of semiconductor device 10.

Although FIGS. 7–9 illustrate the stereolithographic fabrication of heat sink 20 on a substrate, such as a semiconductor device 10, a wafer 72, or another substrate, heat sink 20 can be fabricated separately from a substrate, then secured thereto by known processes, such as by the use of a suitable adhesive material.

The use of a stereolithographic process as exemplified above to fabricate heat sink 20 is particularly advantageous since a large number of heat sinks 20 may be fabricated in a short time, the dimensions and positions thereof are computer controlled to be extremely precise, wastage of construction material 86 is minimal, and the stereolithography method requires minimal handling of semiconductor devices 10, wafers 72, or other substrates.

Stereolithography is also an advantageous method of fabricating heat sinks according to the present invention since, when resinous binders are used to secure adjacent particles of thermally conductive material in selected regions, stereolithography can be conducted at substantially ambient temperature, the small spot size and rapid traverse of laser beam 98 resulting in negligible thermal stress upon semiconductor devices 10, wafers 72, or other substrates, as well as on the features thereof.

The stereolithography fabrication process may also advantageously be conducted at the wafer level or on multiple substrates, saving fabrication time and expense. As the stereolithography method of the present invention recognizes specific semiconductor devices 10 or other substrates, variations between individual substrates are accommodated. Accordingly, when the stereolithography method of the present invention is employed, heat sinks 20 can be simultaneously fabricated on different types of semiconductor devices 10 or other substrates, as well as on both semiconductor devices 10 and other substrates.

Stereolithography may also be used to form a wafer-level array of heat sinks separately from a semiconductor wafer, each heat sink of the array corresponding to a semiconductor device of the wafer. These heat sinks can be bonded to a wafer, then the wafer separately singulated with the heat sinks being simultaneously singulated.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of fabricating a heat sink configured to be assembled with a semiconductor device, comprising:
providing a first layer of thermally conductive material;
defining at least boundaries of a corresponding, first layer of the heat sink in the first layer of thermally conductive material;
providing at least one additional layer of thermally conductive material;
superimposing the at least one additional layer of thermally conductive material over the first layer of thermally conductive material;
defining at least boundaries of at least one additional, corresponding layer of the heat sink in the at least one additional layer of thermally conductive material; and
securing the at least one additional layer of the heat sink to the first layer of the heat sink.

2. The method of claim 1, wherein providing a first layer comprises providing a layer of particulate material.

3. The method of claim 2, wherein defining at least boundaries of the corresponding, first layer of the heat sink comprises consolidating particles located in regions of the first layer of thermally conductive material that correspond to at least boundaries of the first layer of the heat sink.

4. The method of claim 3, wherein consolidating also includes consolidating particles located in regions of the first layer of thermally conductive material that correspond to solid regions of the first layer of the heat sink.

5. The method of claim 3, wherein consolidating comprises sintering adjacent particles in the regions of the first layer of thermally conductive material that correspond to at least boundaries of the first layer of the heat sink.

6. The method of claim 3, wherein consolidating comprises securing adjacent particles in the regions of the first layer of thermally conductive material that correspond to at least boundaries of the first layer of the heat sink with a binder material.

7. The method of claim 1, wherein providing a first layer of thermally conductive material comprises providing a sheet of thermally conductive material.

8. The method of claim 7, wherein defining at least boundaries of the corresponding, first layer of the heat sink comprises cutting the first layer of thermally conductive material in locations corresponding to boundaries of the corresponding, first layer of the heat sink.

9. A method of securing a heat sink to a semiconductor device, comprising:
providing a fabrication substrate including a plurality of unsingulated semiconductor devices;
securing heat sinks to selected ones of the semiconductor devices of the fabrication substrate; and
dicing the semiconductor devices from the fabrication substrate.

10. The method of claim 9, wherein securing the heat sinks comprises securing heat sinks each comprising a plurality of superimposed, contiguous, mutually adhered layers of thermally conductive material to the selected ones of the semiconductor devices.

11. The method of claim 9, wherein said securing comprises securing an array of heat sinks to the fabrication substrate and further comprising singulating at least some of said semiconductor devices from the fabrication substrate.

12. The method of claim 9, wherein securing the heat sinks comprises stereolithographically fabricating the heat sinks on the selected ones of the semiconductor devices.

13. The method of claim 12, wherein stereolithographically fabricating comprises:
forming a substantially uniform layer including unconsolidated particles of thermally conductive material;
consolidating particles in selected areas of the layer to form a corresponding layer of each of the heat sinks; and
repeating the forming and consolidating until the heat sinks are completed.

14. The method of claim 13, wherein consolidating comprises sintering adjacent particles in the selected areas.

15. The method of claim 13, wherein consolidating comprises securing adjacent particles in the selected areas together with a binder.

16. The method of claim 12, wherein stereolithographically fabricating comprises:
providing a sheet of thermally conductive material;
cutting the sheet in selected areas to define peripheries of corresponding layers of the heat sinks; and
repeating the providing and the cutting until the heat sinks are completed.

17. A method of fabricating a heat sink for use on a semiconductor device, comprising:
providing at least one substrate; and
sequentially forming adjacent, mutually adhered regions in accordance with a program to define the heat sink proximate a surface of the at least one substrate.

18. The method of claim 17, wherein sequentially forming comprises forming each of the regions from a particulate, thermally conductive material.

19. The method of claim 17, wherein sequentially forming comprises forming each of the regions from a sheet of thermally conductive material.

20. The method of claim 17, wherein providing at least one substrate comprises providing at least one semiconductor device.

21. The method of claim 20, wherein providing at least one semiconductor device comprises providing at least one fabrication substrate including a plurality of semiconductor dice.

22. A method of fabricating a semiconductor device component, comprising:
placing at least one substrate with a surface thereof in a horizontal plane;
recognizing a location and orientation of the surface of the at least one substrate; and
stereolithographically fabricating a heat sink proximate the surface of the at least one substrate, the heat sink comprising at least one layer of at least partially consolidated material.

23. The method of claim 22, further comprising storing data including at least one physical parameter of the at least one substrate and of the heat sink in computer memory, and using the stored data in conjunction with a machine vision system to recognize the location and orientation of the at least one substrate.

24. The method of claim 23, further comprising using the stored data, in conjunction with the machine vision system, to effect the stereolithographically fabricating.

25. The method of claim 22, further including securing the at least one substrate to a carrier prior to placing the surface of the at least one substrate in the horizontal plane.

* * * * *

UNITED STATES PATENT AND TRADEMARK OFFICE
CERTIFICATE OF CORRECTION

| | | |
|---|---|---|
| PATENT NO. | : 7,026,191 B2 | Page 1 of 1 |
| APPLICATION NO. | : 10/449219 | |
| DATED | : April 11, 2006 | |
| INVENTOR(S) | : Williams et al. | |

It is certified that error appears in the above-identified patent and that said Letters Patent is hereby corrected as shown below:

On the Title Page, under Item -57- "Abstract", line 2, delete "cofigured" and insert -- configured --, therefor.

In column 15, line 53, in Claim 8, after "to" insert -- at least --.

Signed and Sealed this

First Day of April, 2008

JON W. DUDAS
*Director of the United States Patent and Trademark Office*